(12) United States Patent
Huang et al.

(10) Patent No.: US 8,796,666 B1
(45) Date of Patent: Aug. 5, 2014

(54) MOS DEVICES WITH STRAIN BUFFER LAYER AND METHODS OF FORMING THE SAME

(71) Applicant: Taiwan Semiconductor Manufacturing Company, Ltd., Hsin-Chu (TW)

(72) Inventors: Yu-Lien Huang, Jhubei (TW); Tung Ying Lee, Hsin-Chu (TW); Chung-Hsien Chen, Taipei (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/871,739

(22) Filed: Apr. 26, 2013

(51) Int. Cl.
*H01L 29/06* (2006.01)

(52) U.S. Cl.
USPC ........ 257/18; 257/19; 257/E29.193; 438/285; 438/938

(58) Field of Classification Search
USPC .............. 257/18, 19, E29.193; 438/285, 938
See application file for complete search history.

(56) References Cited

U.S. PATENT DOCUMENTS 7,045,815 B2 * 5/2006 Yu et al. .......................... 257/43

* cited by examiner

*Primary Examiner* — Tu-Tu Ho
(74) *Attorney, Agent, or Firm* — Slater and Matsil, L.L.P.

(57) ABSTRACT

A device includes a substrate, insulation regions extending into the substrate, and a semiconductor fin higher than top surfaces of the insulation regions. The semiconductor fin has a first lattice constant. A semiconductor region includes sidewall portions on opposite sides of the semiconductor fin, and a top portion over the semiconductor fin. The semiconductor region has a second lattice constant different from the first lattice constant. A strain buffer layer is between and contacting the semiconductor fin and the semiconductor region. The strain buffer layer includes an oxide.

20 Claims, 7 Drawing Sheets

MOS DEVICES WITH STRAIN BUFFER LAYER AND METHODS OF FORMING THE SAME

BACKGROUND

Reduction in the sizes and the inherent features of semiconductor devices (e.g., a Metal-Oxide-Semiconductor (MOS) device) has enabled continued improvement in speed, performance, density, and cost per unit function of integrated circuits over the past few decades.

To enhance the performance of MOS device, stress may be introduced into the channel region of a MOS transistor to improve carrier mobility. Generally, it is desirable to induce a tensile stress in the channel region of an N-type Metal-Oxide-Semiconductor (NMOS) device in a source-to-drain direction, and to induce a compressive stress in the channel region of a P-type Metal-Oxide-Semiconductor (PMOS) device in a source-to-drain direction.

In conventional methods for generating a stress in a channel region of a MOS device, a first semiconductor material is grown on a second semiconductor material through epitaxy. The first and the second semiconductor materials have different lattice constants. Hence, a stress is generated in both the first and the second semiconductor materials. A gate stack is formed over the first semiconductor material to form the MOS device. The first semiconductor material forms the channel of the MOS device, wherein the carrier mobility in the channel region is improved. Due to the lattice mismatch, however, defects also occur at the interface between the first and the second semiconductor material, which defects may include, for example, lattice misfit defects. This may result in a high leakage current.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10B are cross-sectional views of intermediate stages in the formation of semiconductor fins and Fin Field-Effect Transistors (FinFETs) in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Metal-Oxide-Semiconductor (MOS) devices (such as Fin Field-Effect Transistors (FinFETs)) and methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Figure 1:
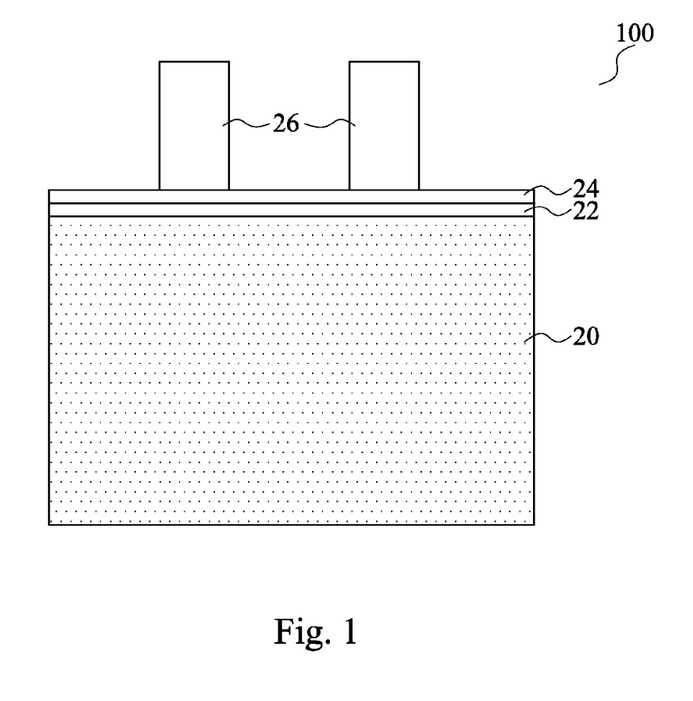

Referring to FIG. 1, semiconductor substrate 20, which is a part of semiconductor wafer 100, is provided. In some embodiments, semiconductor substrate 20 includes crystalline silicon. Other commonly used materials such as carbon, germanium, gallium, boron, arsenic, nitrogen, indium, phosphorus, and/or the like, may also be included in semiconductor substrate 20. Semiconductor substrate 20 may be a bulk substrate or a Semiconductor-On-Insulator (SOI) substrate. In some exemplary embodiments, semiconductor substrate 20 comprises $Si_{1-z}Ge_z$, wherein value z is the atomic percentage of germanium in SiGe, and may be any value ranging from, and including, 0 and 1. When value z is 0, semiconductor substrate 20 is a crystalline silicon substrate. When value z is 1, semiconductor substrate 20 is a crystalline germanium substrate.

Pad layer 22 and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed using thermal nitridation of silicon, Plasma Enhanced Chemical Vapor Deposition (PECVD), or the like. Mask layer 24 is used as a hard mask during subsequent photolithography processes. Photo resist 26 is formed on mask layer 24 and is then patterned.

Figure 2:
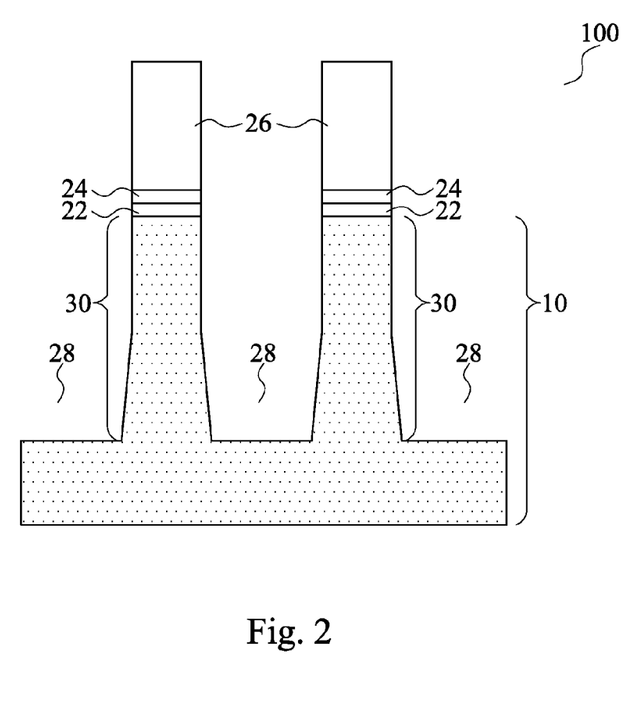

Referring to FIG. 2, mask layer 24 and pad layer 22 are etched through photo resist 26, exposing underlying semiconductor substrate 20. The exposed semiconductor substrate 20 is then etched, forming trenches 28. The portions of semiconductor substrate 20 between neighboring trenches 28 form semiconductor strips 30. Trenches 28 may include strips (when viewed in the top view of wafer 100) that are parallel to each other. After the etching of semiconductor substrate 20, photo resist 26 (FIG. 1) is removed. Next, a cleaning step may be performed to remove a native oxide of semiconductor substrate 20. The cleaning may be performed using diluted hydrofluoric (HF) acid, for example.

Figure 3:
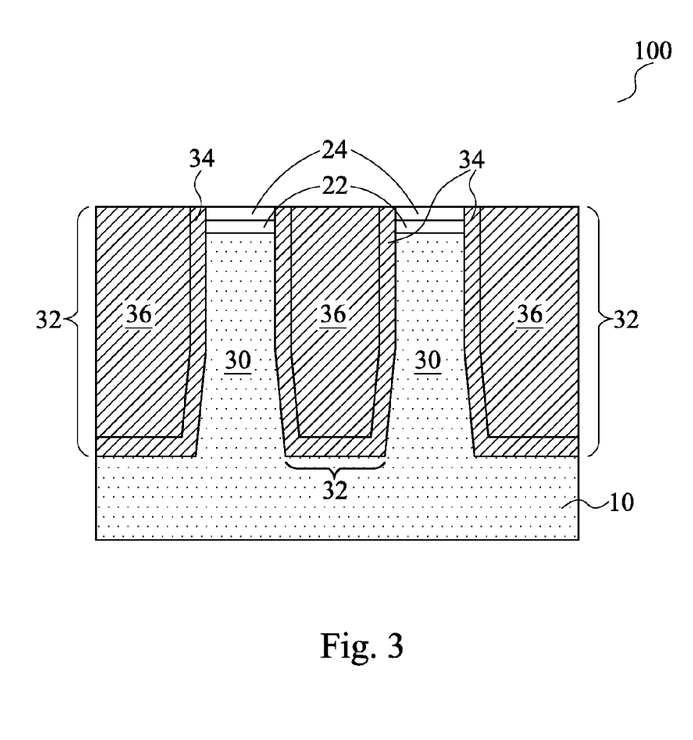

Next, trenches 28 are filled with dielectric materials to form Shallow Trench Isolation (STI) regions 32, as shown in FIG. 3. In accordance with some embodiments, the formation of STI regions 32 includes forming liner oxide 34, and then filling the remaining portions of trenches 28 with dielectric material 36, wherein liner oxide 34 and dielectric material 36 in combination form STI regions 32. Liner oxide 34 may be a conformal layer whose horizontal portions and vertical portions have thicknesses close to each other. For example, liner oxide 34 may be a thermal oxide (such as silicon dioxide) having a thickness between about 10 Å and about 40 Å. In some embodiments, liner oxide 34 is formed using In-Situ Steam Generation (ISSG), with water steam or a combined gas of hydrogen ($H_2$) and oxygen ($O_2$) used to oxidize semiconductor strips 30, The ISSG oxidation may be performed at an elevated temperature. Dielectric regions 36 may be formed, for example, using a method selected from spin-on coating, Flowable Chemical Vapor Deposition (FCVD), and the like. Dielectric region 36 may include highly-flowable materials.

An anneal step may then be performed on wafer 100. Dielectric material 36 is solidified as a result of the anneal. In some embodiments, depending on what material is comprised in dielectric regions 36 before the anneal step, and further depending on the process conditions of the anneal step, after the anneal, dielectric regions 36 mainly comprise silicon and oxygen atoms.

A planarization such as Chemical Mechanical Polish (CMP) is then performed, as shown in FIG. 3, and hence STI regions 32 are formed. STI regions 32 comprise the remaining portions of liner oxide 34 and dielectric layer 36. Mask layer 24 is used as the CMP stop layer, and hence the top surface of mask layer 24 is substantially level with the top surfaces of dielectric regions 36.

Figure 4:
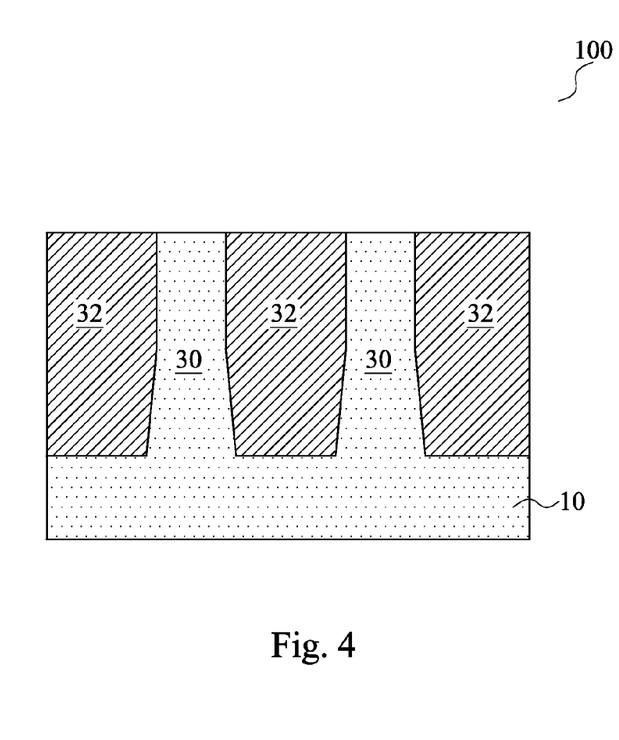
Figure 5:
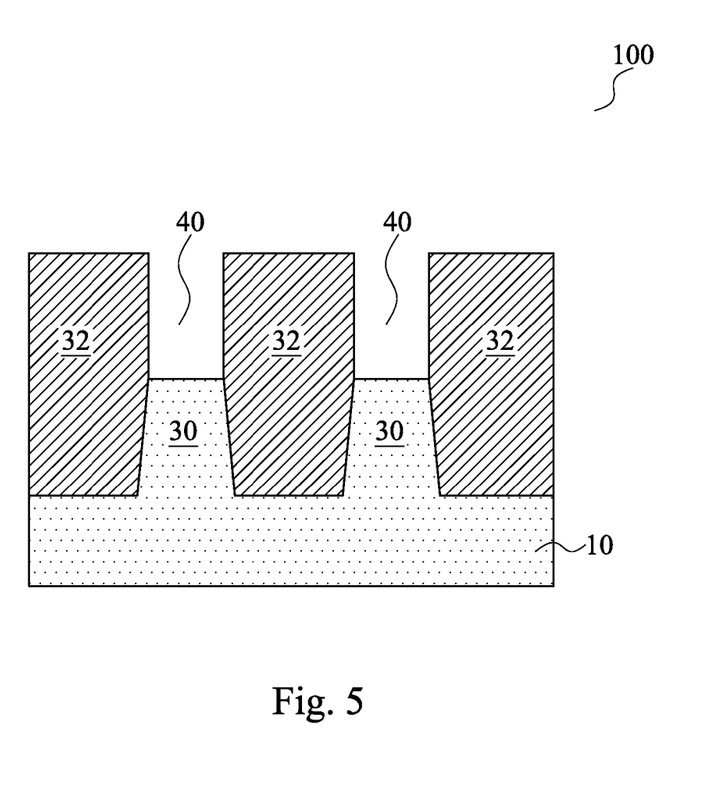

FIG. 4 illustrates the removal of mask layer 24 and pad oxide layer 22. Mask layer 24, if formed of silicon nitride, may be removed by a wet process using hot $H_3PO_4$. Pad oxide layer 22 may be removed using diluted HF. Next, as shown in FIG. 5, semiconductor strips 30 are recessed, forming recesses 40 between neighboring STI regions 32. In some embodiments, the bottoms of recesses 40 are higher than the bottom surfaces of STI regions 32. In alternative embodiments, the bottoms of recesses 40 are substantially level with or lower than the bottom surfaces of STI regions 32. In some exemplary embodiments, the etching is performed through an isotropic etching such as wet etching, for example, using $NH_4OH$, Tetra-Methyl Ammonium Hydroxide (TMAH), a potassium hydroxide (KOH) solution, or the like, as an etchant. In some exemplary embodiments, the etching is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The process gases include, for example, fluorine-containing gases (such as $CF_4$), Chlorine-containing gases (such as $Cl_2$), HBr, and/or the like.

Figure 6:
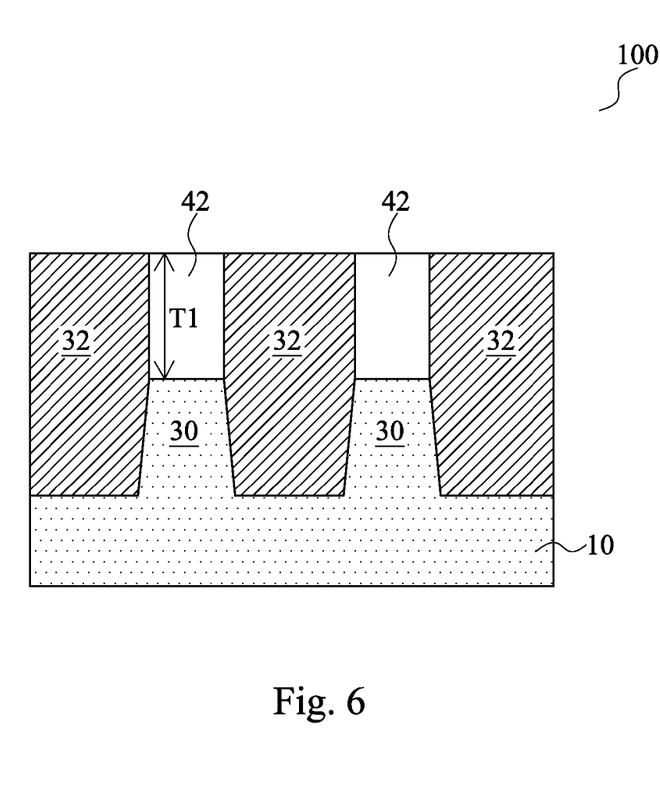

Referring to FIG. 6, semiconductor regions 42 are grown in recesses 40 (FIG. 5) through epitaxy, and the resulting semiconductor regions 42 are crystalline regions. Semiconductor regions 42 may have a lattice constant (and a composition) different from the lattice constant (and the composition) of substrate 20. In some embodiments, semiconductor regions 42 comprise silicon germanium, which is expressed as $Si_{1-x}Ge_x$, wherein value X is the atomic percentage of germanium in semiconductor regions 42, which atomic percentage may be between about 0 (0 percent) and 1 (100 percent) in exemplary embodiments. Semiconductor regions 42 may also comprise pure germanium (when x is equal to 1) or substantially pure germanium (when x is greater than about 0.9, for example). Semiconductor regions 42 may also comprise pure silicon (when x is equal to 0) or substantially pure silicon (when x is smaller than about 0.1, for example). In these embodiments, however, the steps in FIGS. 5 and 6 may be skipped, and semiconductor regions 42 are portions of the original substrate 10. Semiconductor regions 42 may be relaxed semiconductor regions, and at least the top portions of semiconductor regions 42 are relaxed with substantially no internal stress. This may be achieved by, for example, making thickness T1 of semiconductor regions 42 to be great enough. Since the stresses in upper portions of semiconductor regions 42 are increasingly smaller than the lower portions, with an adequately high thickness T1, the top portions of semiconductor regions 42 are relaxed. In some exemplary embodiments, thickness T1 is greater than about 30 nm.

Semiconductor regions 42 may be grown to a level higher than the top surfaces of STI regions 32. A CMP is then performed to level the top surface of STI regions 32 and semiconductor regions 42. The resulting structure is shown in FIG. 6. In alternative embodiments, the growth of semiconductor regions 42 stops at a time when the top surfaces of semiconductor regions 42 are level with or lower than the top surfaces of STI regions 32. In these embodiments, the CMP may be performed, or may be skipped.

Figure 7:
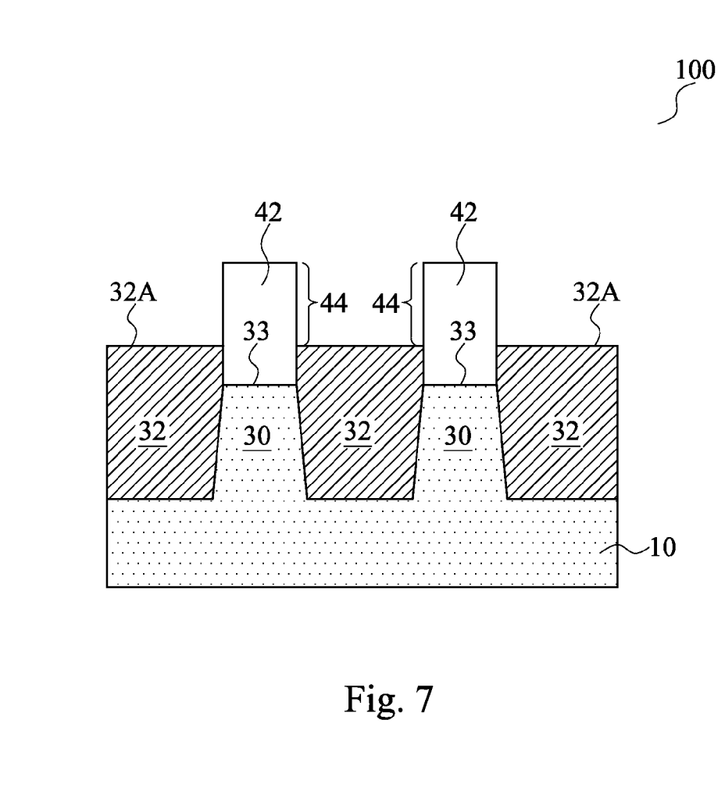

Referring to FIG. 7, STI regions 32 are recessed, for example, through an etching step, wherein diluted HF, SiCoNi (including HF and $NH_3$), or the like, may be used as the etchant. The top surfaces 32A of the remaining STI regions 32 may be higher than the interfaces 33 between semiconductor regions 42 and semiconductor strips 30. The portions of semiconductor regions 42 that are higher than top surfaces 32A are referred to as semiconductor fins 44 hereinafter.

Figure 8:
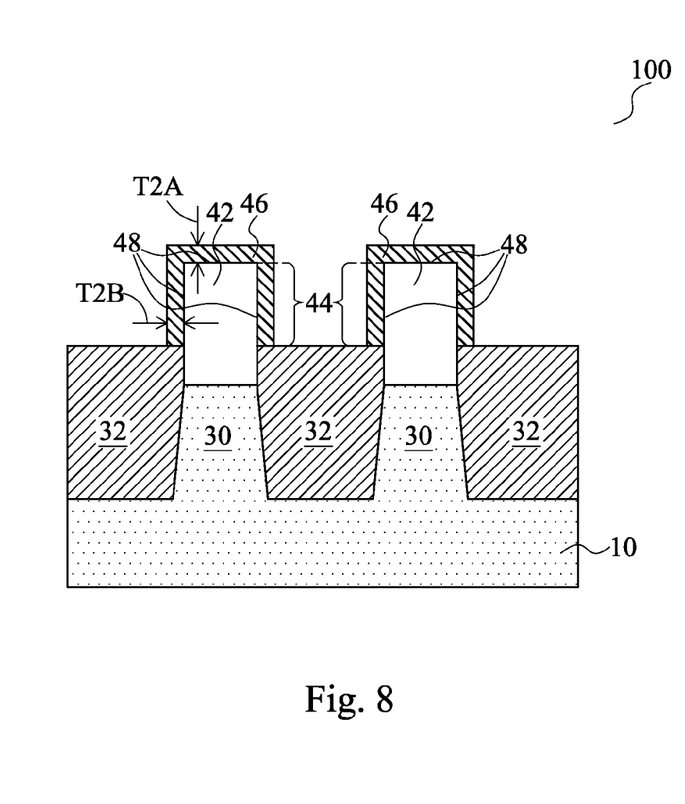

FIG. 8 illustrates the formation of semiconductor regions 46, which are epitaxially grown on the exposed top surfaces and sidewalls of semiconductor fins 44. Semiconductor regions 46 hence are crystalline semiconductor regions. Semiconductor regions 46 may be substantially conformal layers, with the portions on the top surfaces of semiconductor fins 44 having thickness T2A close to the thickness T2B of the portions on the sidewalls of semiconductor fins 44. In some embodiments, each of thicknesses T2A and T2B is between about 1 nm and about 30 nm.

In some embodiments, semiconductor regions 46 comprise $Si_{1-y}Ge_y$, wherein value Y is the atomic percentage of silicon in semiconductor regions 46. Value Y may be any value between, and including, 0 and 1. Value Y may be equal to 1, which means that semiconductor regions 46 are pure germanium regions free from silicon. Value Y may also be equal to 0, which means that semiconductor regions 46 are pure silicon regions free from germanium.

In accordance with some embodiments. The materials of semiconductor regions 42 and 46 are different from each other, and the lattice constants of semiconductor regions 42 and 46 are different from each other, so that stresses are generated in semiconductor regions 42 and 46. At interface 48 between semiconductor regions 42 and 46 and the regions nearby (also referred to as interface regions 48), there are also stresses generated due to the lattice mismatch. The difference between values X and Y may also be greater than about 0.3. In accordance with various embodiments, value X may be greater than or smaller than value Y.

In some embodiments in which the FinFET formed on fins 44 is an N-type FinFET, value Y is smaller than value X, so that a tensile stress is generated in the channel of the resulting N-type FinFET. The lattice constant of semiconductor regions 46 is thus smaller than the lattice constant of semiconductor fins 44. For example, semiconductor regions 46 may be pure silicon regions, substantially pure silicon (for example, with Y<0.1) regions, or SiGe regions, and semiconductor fins 44 may be SiGe regions or pure or substantially pure (with X>0.9) germanium regions.

In alternative embodiments in which the FinFET formed on fins 44 is a P-type FinFET, value Y is greater than value X, so that a compressive stress is generated in the channel of the resulting P-type FinFET. The lattice constant of semiconductor regions 46 is thus greater than the lattice constant of semiconductor fins 44. For example, semiconductor fins 44 may be SiGe regions or pure silicon or substantially pure silicon (for example, with X<0.1) regions, and semiconductor regions 46 may be SiGe regions or pure or substantially pure (with Y>0.9) germanium regions.

Figure 9A:
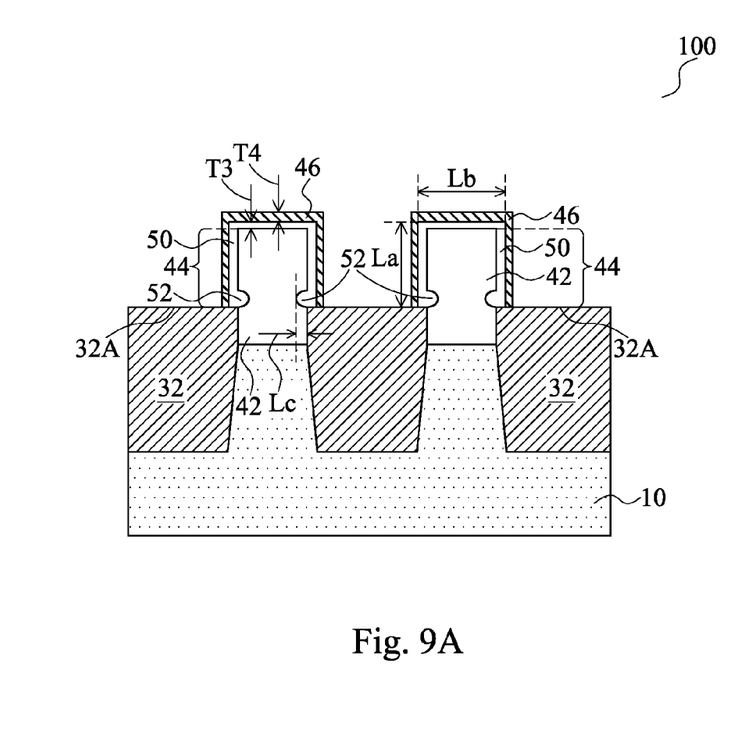

FIG. 9A illustrates the oxidation process to form strain buffer layer 50. The oxidation is performed by exposing wafer 100 in an oxygen-containing environment. In some embodiments, the oxidation comprises a plasma oxidation using an oxygen-containing gas (such as $O_2$) as a process gas. The plasma oxidation may be performed using a production tool that is used for dry etch, except that instead of using an etchant gas, the oxygen-containing gas is used, and hence the plasma oxidation rather than the etching is performed. The available tools include, and are not limited to, the tools for Inductively Coupled Plasma (ICP), the tools for Transformer Coupled Plasma (TCP), the tools for Electron Cyclotron Resonance (ECR), and the like. In an exemplary plasma oxidation process, in the chamber for the plasma oxidation, the $O_2$ has a pressure of between about 5 mTorr and about 20 mTorr, and the flow rate of $O_2$ may be between about 50 sccm and about 400 sccm. The RF power may be between about 400 watts and about 800 watts, and the DC bias may be between about 0V and about 60V.

In alternative embodiments, the plasma oxidation is performed using downstream plasma. In an exemplary plasma oxidation process, in the chamber for the downstream plasma, $O_2$ has a pressure of between about 500 mTorr and about 2,000 mTorr, and the flow rate of $O_2$ is between about 1,000 sccm and about 4,000 sccm. The process gas may further comprise a forming gas, which includes hydrogen ($H_2$) and nitrogen ($N_2$), with $H_2$ having a flow rat percentage of about 2 percent and about 10 percent in the forming gas. The RF power may be between about 1,000 watts and about 3,000 watts, and the DC bias may be about 0V.

In yet other embodiments, the oxidation process is performed using a high-temperature anneal. In accordance with some embodiments, the high-temperature anneal includes a spike anneal, which is performed in an oxygen-containing environment (for example, containing $O_2$). The annealing temperature may be between about 800° C. and about 1,300° C. The annealing time may be between about 1 second and about 10 seconds.

In accordance with alternative embodiments, the high-temperature anneal includes a soak anneal process by soaking wafer 100 in an oxygen-containing environment (for example, containing $O_2$). The annealing temperature may be between about 800° C. and about 1,200° C. The annealing time may be greater than about 30 seconds.

In accordance with yet alternative embodiments, the high-temperature anneal includes a furnace anneal by exposing wafer 100 in an oxygen-containing environment (for example, $O_2$ containing). The annealing temperature may be between about 450° C. and about 1,200° C. The annealing time may be about one hour or longer.

As a result of the oxidation, strain buffer layers 50 are generated at interface 48 (FIG. 8), and extends into the nearby portions of semiconductor regions 42 and 46. In the meantime, the inner portions of semiconductor fins 44 and the outer portions of semiconductor regions 46 are not oxidized, and remain after the oxidation. In accordance with some embodiments, to form strain buffer layer 50 between semiconductor regions 42 and 46, rather than oxidizing outer portions of semiconductor regions 46 and expand the oxide regions in an inward direction, the oxidation process conditions and the strain in semiconductor regions 42 and 46 are adjusted. It was found that a high strain may help start oxidation from interface 48, rather than from the outer surface layers of semiconductor regions 46. Hence, an adequately high strain needs to be generated at interfaces 48 (FIG. 8), wherein the stress difference between regions 42 and 46 may be greater than about 500 MPa. Furthermore, the process conditions are also controlled so that oxygen may penetrate through interface 48 (FIG. 8) to oxidize the interface regions 48 first. The optimum process conditions are related to various factors including the strain level, the compositions of semiconductor regions 42 and 46, and the oxidation method. The optimum process conditions may be found through experiments.

FIG. 9A illustrates an exemplary resulting structure. In some embodiments, strain buffer layers 50 extend along interfaces 48 (FIG. 8), and are formed on the top surface and opposite sidewalls of semiconductor fins 44. Strain buffer layers 50 may fully separate semiconductor fins 44 from the overlying semiconductor regions 46 electrically and physically. In some embodiments, strain buffer layers 50 comprise silicon oxide, germanium oxide, or combinations thereof. As a result of the oxidation, notches 52 may be formed to extend into semiconductor fins 44, wherein notches 52 are substantially level with the top surface 32A of STI regions 32. Strain buffer layers 50 extend along interfaces 48 much further than toward the centers of fins 44. For example, assuming the sidewall portions of strain buffer layers 50 have length La, and the top portions of strain buffer layers have length Lb, then value (2La+Lb) is greater than depth Lc of notches 52. Thickness T3 of strain buffer layers 50 may be between about 1 nm and about 30 nm. Thickness T4 of the remaining portions of semiconductor regions 46 may be between about 1 nm and about 30 nm in some embodiments.

Figure 9B:
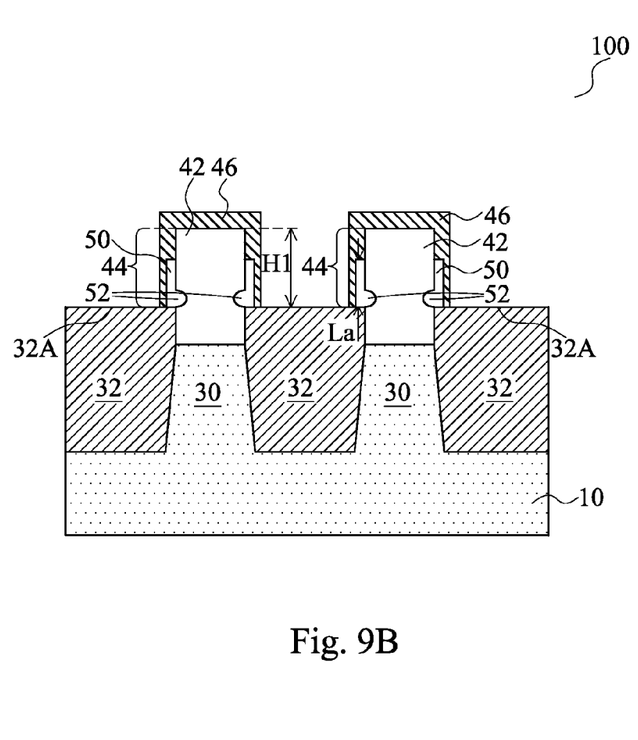
Figure 9C:
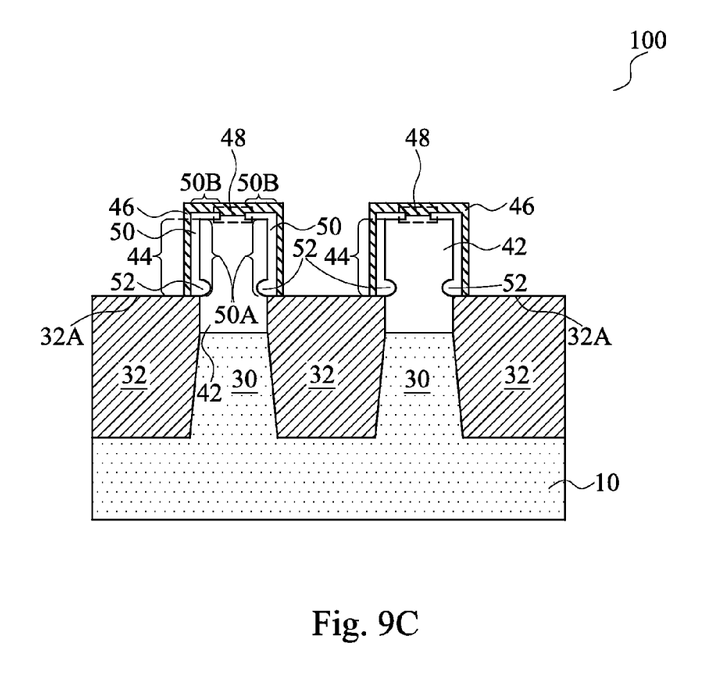

FIGS. 9B and 9C illustrate alternative embodiments in which semiconductor regions 42 and 46 are partially separated from each other by strain buffer layer 50. FIG. 9B illustrates a cross-sectional view of wafer 100 in accordance with alternative embodiments. In these embodiments, strain buffer layers 50 extend from where semiconductor regions 46 contact top surfaces 32A of STI regions 32, and extend upwardly. Strain buffer layers 50 are thus generated along interfaces 48, are formed on the opposite sides of the bottom portions the respective semiconductor fins 44. No strain buffer layers 50 are formed over semiconductor fins 44, and no strain buffer layers 50 are formed on opposite sides of the top portions of semiconductor fins 44. In some embodiments, length La of each of the sidewall portions of strain buffer layers 50 is greater than about 25 percent, greater than 50 percent, or greater than about 75 percent, of height H1 of semiconductor fins 44.

FIG. 9C illustrates a cross-sectional view of wafer 100 in accordance with yet alternative embodiments. In these embodiments, strain buffer layers 50 are formed on the opposite sides of semiconductor fins 44, and separate the entireties of sidewall surfaces of semiconductor fins 44 from the sidewall portions of semiconductor regions 46. Strain buffer layer portions 50B also extend overlying, and overlapping, portions semiconductor fins 44. The portions 50B of strain buffer layers 50 over a same one of semiconductor fins 44, however, are separated by the un-oxidized interface regions 48.

Figure 10A:
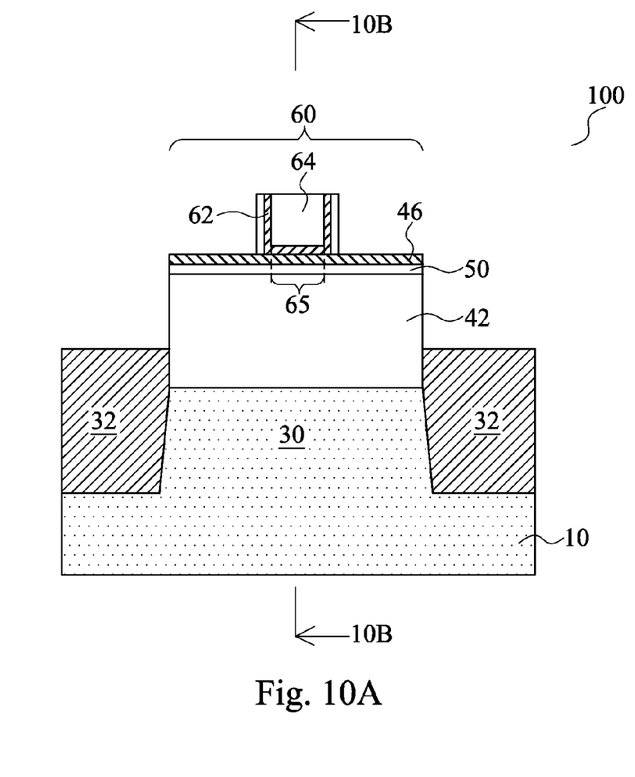
Figure 10B:
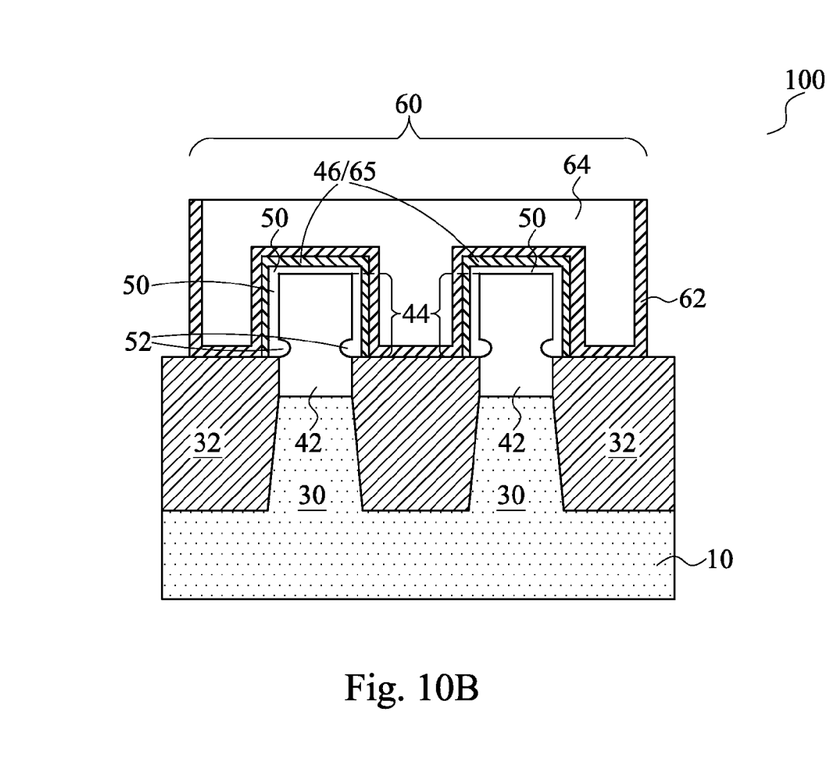

The structure shown in FIGS. 9A, 9B, and 9C may be used to form FinFET 60, as shown in FIGS. 10A and 10B. Referring to FIG. 10, gate dielectric 62 and gate dielectric 62 are formed. Gate dielectric 62 may be formed of a dielectric material such as silicon oxide, silicon nitride, an oxynitride, multi-layers thereof, and/or combinations thereof. Gate dielectric 62 may also be formed of high-k dielectric materials. The exemplary high-k materials may have k values greater than about 4.0, or greater than about 7.0. Gate electrode 64 may be formed of doped polysilicon, metals, metal nitrides, metal silicides, and the like. After the formation of gate dielectric 62 and gate dielectric 62, source and drain regions 66 are formed.

As shown in FIG. 10A, channel region 65 is formed in semiconductor regions 46, and may comprise sidewall portions and top portions of semiconductor regions 46 (FIG. 10B). Channel regions 65 may be separated from the underlying semiconductor fins 44 fully or partially by strain buffer layers 50. FIG. 10B illustrates a cross-sectional view of FinFET 60, wherein the cross-sectional view is obtained from the plane crossing 10B-10B in FIG. 10A. FIG. 10B illustrates that gate dielectric 62 and gate electrode 64 comprise sidewall portions on the opposite sides of each of semiconductor fins 44 and top portions overlapping top surface of semiconductor fins 44.

FIGS. 10A and 10B illustrate the embodiments in which FinFET 60 is formed using a gate-last approach. In alternative embodiments, FinFET 60 may be formed using a gate-first approach. The resulting FinFET 60 has a structure similar to what is shown in FIGS. 10A and 10B, except that gate dielectric 62 will not extend on the sidewalls of the respective gate electrode 64.

Figure 11:
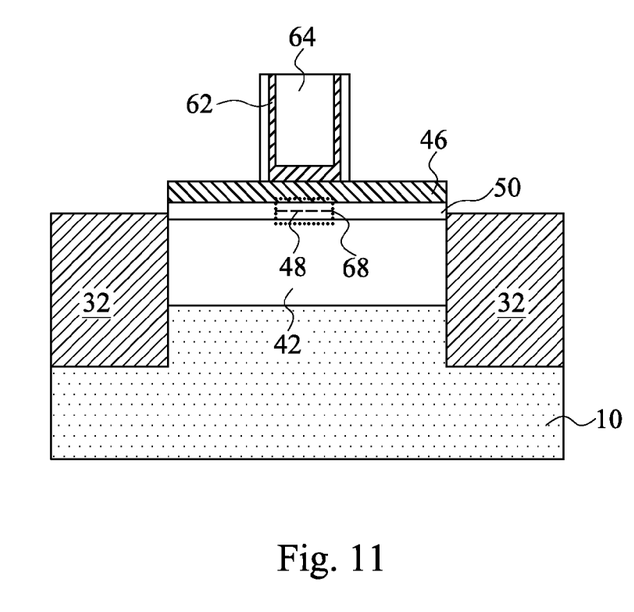
FIG. 11 illustrates a cross-sectional view of a planar transistor in accordance with alternative embodiments.

Although the formation of a FinFET is used as an example to explain the concept of the present disclosure, the concept may also be used to form a planar MOS transistor, as shown in FIG. 11. In which embodiments, a planar semiconductor layer 46 is formed on a top surface of semiconductor layer 42, wherein semiconductor layer 46 and semiconductor layer 42 are formed of essentially the same materials (by using the same methods) as semiconductor regions 46 and 42, respectively, in FIG. 8. An oxidation process is performed using essentially the same process as shown in FIGS. 9A, 9B, and 9C, and a planar strain buffer layer 50 will be formed between semiconductor layers 42 and 46. In some embodiments, semiconductor regions 46 and 42 are fully separated from each other by strain buffer layer 50. In alternative embodiments, after the oxidation, the portions of semiconductor regions 46 and 42 in dashed region 68 are not oxidized, and are in contact with each other.

In accordance with the embodiments of the present disclosure, the interface regions (FIG. 8) of semiconductor regions that have mismatched lattice constants, which interface regions are more prone to defects such as lattice misfit defects, are oxidized to form strain buffer layers. The defects are hence eliminated in the oxidation. In addition, the oxide regions may fully separate the channel regions from the underlying semiconductor layers. Hence, the leakage currents are reduced.

In accordance with some embodiments, a device includes a substrate, insulation regions extending into the substrate, and a semiconductor fin higher than top surfaces of the insulation regions. The semiconductor fin has a first lattice constant. A semiconductor region includes sidewall portions on opposite sides of the semiconductor fin, and a top portion over the semiconductor fin. The semiconductor region has a second lattice constant different from the first lattice constant. A strain buffer layer is between and contacting the semiconductor fin and the semiconductor region. The strain buffer layer includes an oxide.

In accordance with other embodiments, a device includes a first semiconductor region, wherein the first semiconductor region has a first lattice constant, and a second semiconductor region over the first semiconductor region. The second semiconductor region has a second lattice constant different from the first lattice constant. A strain buffer layer is between and contacting the first semiconductor region and the second semiconductor region, wherein the strain buffer layer includes an oxide of the first semiconductor region and an oxide of the second semiconductor region. A gate dielectric is overlying the second semiconductor region. A gate electrode is overlying the first semiconductor region.

In accordance with yet other embodiments, a method includes performing an epitaxy to grow a first semiconductor region on a second semiconductor region, wherein the first semiconductor region has a first lattice constant different from a second lattice constant of the second semiconductor region. The method further includes performing an oxidation process to form an oxide in an interface region between the first semiconductor region and the second semiconductor region. In the oxidation process, portions of the first semiconductor region and the second semiconductor region in an interface region between the first semiconductor region and the second semiconductor region are oxidized to form an oxide region. A portion of the first semiconductor region remains after the oxidation process, and is separated from the second semiconductor region by the oxide region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate;
   insulation regions extending into the substrate;
   a semiconductor fin higher than top surfaces of the insulation regions, wherein the semiconductor fin has a first lattice constant;
   a semiconductor region having a second lattice constant different from the first lattice constant, wherein the semiconductor region comprises:
      sidewall portions on opposite sides of the semiconductor fin; and
      a top portion over the semiconductor fin; and
   a strain buffer layer between and contacting the semiconductor fin and the semiconductor region, wherein the strain buffer layer comprises an oxide.

2. The device of claim 1, wherein the strain buffer layer comprises portions separating the sidewall portions of the semiconductor region from sidewalls of the semiconductor fin.

3. The device of claim 2, wherein the strain buffer layer fully separates the sidewall portions of the semiconductor region from sidewalls of the semiconductor fin.

4. The device of claim 1, wherein the strain buffer layer comprises sidewall portions on opposite sides of the semiconductor fin, and a top portion overlying the semiconductor fin, and wherein the strain buffer layer fully separates the semiconductor region from the semiconductor fin.

5. The device of claim 1, wherein the first lattice constant is greater than the second lattice constant.

6. The device of claim 1, wherein the first lattice constant is smaller than the second lattice constant.

7. The device of claim 1, wherein the semiconductor region forms a channel region of a Fin Field-Effect Transistor (FinFET), and wherein the FinFET further comprises:
   a gate dielectric comprising sidewall portions on opposite sides of the semiconductor region, and a top portion over the semiconductor region; and
   a gate electrode over the gate dielectric.

8. A device comprising:
   a first semiconductor region, wherein the first semiconductor region has a first lattice constant;

a second semiconductor region over the first semiconductor region, wherein the second semiconductor region has a second lattice constant different from the first lattice constant;
a strain buffer layer between and contacting the first semiconductor region and the second semiconductor region, wherein the strain buffer layer comprises an oxide of the first semiconductor region and an oxide of the second semiconductor region;
a gate dielectric overlying the second semiconductor region; and
a gate electrode overlying the first semiconductor region.

9. The device of claim 8, wherein each of the first semiconductor region and the second semiconductor region comprises a material selected from the group consisting essentially of silicon, germanium, and combinations thereof.

10. The device of claim 8, wherein the strain buffer layer fully separates the first semiconductor region from the second semiconductor region.

11. The device of claim 8, wherein in a region overlapped by the gate dielectric, the first semiconductor region is in contact with the second semiconductor region, and wherein the strain buffer layer comprises portions on opposite sides of the region.

12. The device of claim 8, wherein the strain buffer layer, the gate dielectric, and the gate electrode form a Fin Field-Effect Transistor (FinFET), with the strain buffer layer forming a channel of the FinFET.

13. The device of claim 12, wherein the strain buffer layer and the second semiconductor region extends on opposite sides of, and level with, the first semiconductor region.

14. The device of claim 8, wherein the strain buffer layer, the gate dielectric, and the gate electrode form a planar transistor.

15. A method comprising:
performing an epitaxy to grow a first semiconductor region on a second semiconductor region, wherein the first semiconductor region has a first lattice constant different from a second lattice constant of the second semiconductor region; and
performing an oxidation process to form an oxide in an interface region between the first semiconductor region and the second semiconductor region, wherein in the oxidation process, portions of the first semiconductor region and the second semiconductor region in an interface region between the first semiconductor region and the second semiconductor region are oxidized to form an oxide region, and wherein a portion of the first semiconductor region remains, and is separated from the second semiconductor region by the oxide region.

16. The method of claim 15 further comprising:
forming a gate dielectric over the remaining portion of the first semiconductor region; and
forming a gate electrode over the gate dielectric.

17. The method of claim 15, wherein after the oxidation process, the oxide region fully separates the first semiconductor region from the second semiconductor region.

18. The method of claim 15, wherein after the oxidation process, the oxide region partially separates the first semiconductor region from the second semiconductor region.

19. The method of claim 15, wherein the oxidation process comprises annealing the first semiconductor region and the second semiconductor region in an oxygen-containing environment.

20. The method of claim 15, wherein the oxidation process comprises exposing the first semiconductor region and the second semiconductor region to an oxygen-containing plasma.

* * * * *